United States Patent
Jin et al.

(10) Patent No.: US 10,998,707 B2
(45) Date of Patent: May 4, 2021

(54) ARC DETECTION DEVICE, CORRESPONDING METHOD, AND ELECTRONIC COMPONENT

(71) Applicant: Robert Bosch GmbH, Stuttgart (DE)

(72) Inventors: Jiahang Jin, Kornwestheim (DE); Arndt Wagner, Eberdingen (DE); Hans Geyer, Leinfelden-Echterdingen (DE)

(73) Assignee: Robert Bosch GmbH, Stuttgart (DE)

( * ) Notice: Subject to any disclaimer, the term of this patent is extended or adjusted under 35 U.S.C. 154(b) by 487 days.

(21) Appl. No.: 16/063,620

(22) PCT Filed: Dec. 7, 2016

(86) PCT No.: PCT/EP2016/080035
§ 371 (c)(1),
(2) Date: Jun. 18, 2018

(87) PCT Pub. No.: WO2017/102489
PCT Pub. Date: Jun. 22, 2017

(65) Prior Publication Data
US 2020/0271712 A1    Aug. 27, 2020

(30) Foreign Application Priority Data

Dec. 16, 2015 (DE) .......................... 102015225442.9

(51) Int. Cl.
*H02H 3/08*    (2006.01)
*H02H 1/00*    (2006.01)
(Continued)

(52) U.S. Cl.
CPC ........... *H02H 1/0015* (2013.01); *G01R 23/16* (2013.01); *G01R 31/1272* (2013.01);
(Continued)

(58) Field of Classification Search
CPC .......... H02H 1/0015; H02H 3/50; H02H 3/52; H02H 3/08; H02H 1/0092; G01R 31/1272; G01R 23/16
See application file for complete search history.

(56) References Cited

U.S. PATENT DOCUMENTS 5,578,931 A * 11/1996 Russell .............. G01R 31/1272
324/536
5,963,406 A    10/1999 Neiger et al.
(Continued)

FOREIGN PATENT DOCUMENTS

CN    105093082 A    11/2015
DE    102012218504 A1    4/2014

OTHER PUBLICATIONS

International Search Report with English translation and Written Opinion for Application No. PCT/EP2016/080035 dated Mar. 21, 2017 (13 pages).

*Primary Examiner* — Harry R Behm
(74) *Attorney, Agent, or Firm* — Michael Best & Friedrich LLP (57) ABSTRACT

The invention relates to a detection device (100) for detecting an arc (104*a-i*; 909) occurring between a first current-carrying element (103; 903*a*) and at least one conductive element (103*b*, 108; 903*b*, 907), comprising at least one measuring device (101; 901, 902), which is designed to measure a current (I) flowing through the first current-carrying element (103*a*; 903*a*), and an analysis device (102) which is designed to determine a frequency spectrum of the measured current (I) and to detect the arc (104*a-i*; 909) occurring between the first current-carrying element (103*a*; 903*a*) and the at least one conductive element (103*b*, 108; 903*b*, 907) on the basis of a high-frequency range of the determined frequency spectrum.

11 Claims, 5 Drawing Sheets

(51) Int. Cl.
    *G01R 31/12*     (2020.01)
    *H02H 3/52*     (2006.01)
    *G01R 23/16*     (2006.01)
    *H02H 3/50*     (2006.01)
    *G01R 31/52*     (2020.01)

(52) U.S. Cl.
    CPC ........... *G01R 31/52* (2020.01); *H02H 1/0092* (2013.01); *H02H 3/08* (2013.01); *H02H 3/50* (2013.01); *H02H 3/52* (2013.01)

(56) References Cited

U.S. PATENT DOCUMENTS

| | | | |
|---|---|---|---|
| 6,625,550 | B1 | 9/2003 | Scott et al. |
| 9,995,796 | B1* | 6/2018 | Johnson ............... G01R 31/129 |
| 2010/0097733 | A1 | 4/2010 | E. |
| 2013/0094112 | A1* | 4/2013 | Burghardt ......... H01L 31/02021 |
| | | | 361/42 |
| 2013/0221973 | A1* | 8/2013 | Whisenand ............ G01R 31/28 |
| | | | 324/501 |
| 2013/0307556 | A1* | 11/2013 | Ledenev ................ G01R 31/50 |
| | | | 324/509 |
| 2014/0062500 | A1* | 3/2014 | Behrends ............... G01R 31/50 |
| | | | 324/537 |
| 2014/0218044 | A1 | 8/2014 | Ostrovsky et al. |
| 2015/0372472 | A1* | 12/2015 | Gautier .................... H02H 3/22 |
| | | | 361/91.2 |
| 2016/0020729 | A1* | 1/2016 | Yu .......................... G01R 29/26 |
| | | | 324/761.01 |
| 2016/0216305 | A1* | 7/2016 | Krenz ................... H02H 1/0015 |
| 2017/0324236 | A1* | 11/2017 | Tomita ................... G01R 31/08 |
| 2017/0343596 | A1* | 11/2017 | Misumi ............. G01R 31/1272 |
| 2018/0191145 | A1* | 7/2018 | Mai ........................ G01R 31/50 |
| 2019/0288500 | A1* | 9/2019 | Tomita ................... H02H 3/385 |

\* cited by examiner

Fig. 10

ARC DETECTION DEVICE, CORRESPONDING METHOD, AND ELECTRONIC COMPONENT

BACKGROUND OF THE INVENTION

The present invention relates to a detection device for detecting an arc occurring between a first current-carrying element and at least one conductive element, an electronic component and a method for detecting an arc occurring between a first current-carrying element and a conductive element.

Arcs that occur at high-voltage components, such as are used in particular in electric or hybrid vehicles, must be detected quickly, and suitable countermeasures introduced, before a fire is caused or dangerous voltages become accessible from outside. Arcs can in particular arise when closing switches or as a result of metal chips located in the housing of the high-voltage components, or between current-carrying cables and the housing.

An arc warning device that comprises a high-frequency receiver which detects the arc on the basis of an electromagnetic wave transmitted from the electrical cable and outputs an alarm is known from DE 20 2005 011 504 U1.

SUMMARY OF THE INVENTION

The present invention provides a detection device for detecting an arc occurring between a first current-carrying element and at least one conductive element, an electronic component, and a method for detecting an arc occurring between a first current-carrying element and a conductive element.

The invention accordingly provides a detection device for detecting an arc occurring between a first current-carrying element and at least one conductive element, having at least one measuring device, which is designed to measure a current flowing through the first current-carrying element; and an analysis device which is designed to determine a frequency spectrum of the current measured by the measuring device and to detect the arc occurring between the first current-carrying element and the at least one conductive element on the basis of a high-frequency range of the frequency spectrum that has been determined.

The invention further provides an electronic component with a first current-carrying element, at least one conductive element, and a detection device for detecting an arc occurring between the first current-carrying element and the at least one conductive element.

Finally, the invention provides a method for detecting an arc occurring between a first current-carrying element and a conductive element, having the steps of: measuring a current flowing through the first current-carrying element; determining a frequency spectrum of the measured current; and detecting an arc occurring between the first current-carrying element and the conductive element on the basis of a high-frequency range of the frequency spectrum that has been determined.

The detection device according to the invention has the advantage that an arc that occurs is detected very quickly on the basis of the pronounced high-frequency range of the frequency spectrum. Appropriate countermeasures can thus be introduced immediately after the occurrence of the arc and, for example, the power supply interrupted promptly. Safety is thus increased, since a fire hazard or the risk of an electric shock is reduced.

According to a preferred development of the detection device, the at least one measuring device comprises a Hall sensor and/or a coupling line parallel to the first current-carrying element.

According to a preferred development of the detection device, the analysis device is designed to detect an arc when at least one spectral component in the high-frequency range of the frequency spectrum that has been determined lies above a predetermined value. An arc can be detected effectively and precisely on the basis of its pronounced high-frequency component in the frequency spectrum of the current.

According to a preferred development of the electronic component, the at least one conductive element comprises a second current-carrying element; wherein a current path with a switch is introduced between the first current-carrying element and the second current-carrying element; and wherein the analysis device is designed to close the switch as soon as the analysis device has detected an arc.

According to a preferred development of the electronic component, the switch comprises a power contactor and/or a solenoid switch.

According to a preferred development of the electronic component, a current source that is generating the current is short-circuited through a fuse and the current path when the switch is closed. The current-carrying element is separated from the power supply by tripping the fuse.

According to a preferred development of the electronic component, the at least one conductive element comprises a housing which at least partially encloses the first current-carrying element and the switch; wherein the housing comprises an electrically insulating coating at least in some sections in a surrounding area of the switch. The possibility of an arc arising between the switch and the housing when operating the switch is prevented by the electrically insulating coating.

According to a preferred development of the electronic component, a common-mode filter is connected between the first current-carrying element and the second current-carrying element between a first measuring device and a second measuring device of the at least one measuring device; wherein the analysis device is designed to detect, on the basis of a comparison of the frequency spectrum of the current measured by the first measuring device with the frequency spectrum of the current measured by the second measuring device, whether the detected arc has occurred between the first current-carrying element and/or second current-carrying element and the second current-carrying element or between the first current-carrying element and the housing.

According to a preferred development, the method further comprises the step of: closing a switch inserted in a current path between the first current-carrying element and the conductive element as soon as the analysis device has detected an arc; wherein, when closing the switch, a current source that is generating the current is short-circuited through a fuse and the current path.

DESCRIPTION OF THE DRAWINGS

Here.

Elements and apparatuses that are identical or have the same function are—unless otherwise stated—given the same reference signs in all the figures. Unless otherwise stated, different forms of embodiment can be combined with one another in any desired way.

DETAILED DESCRIPTION

Figure 1:
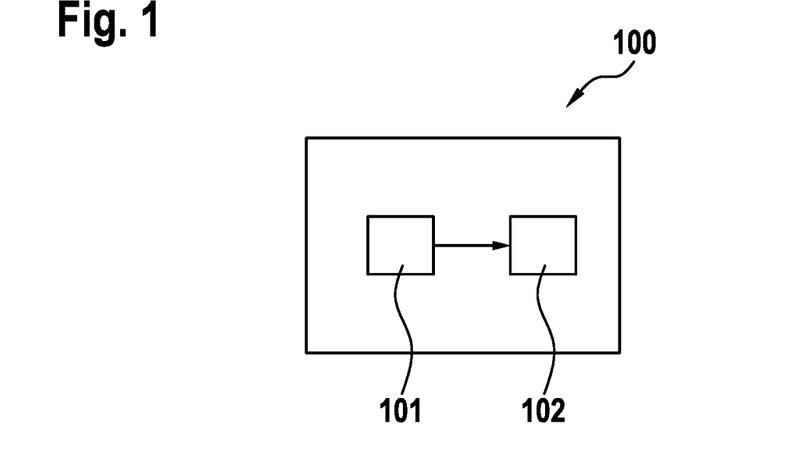
FIG. 1 shows a block diagram of a detection device according to one form of embodiment of the present invention.

FIG. 1 shows a block diagram of a detection device 100 for detecting an arc occurring between a first current-carrying element and at least one conductive element. The detection device 100 comprises a measuring device 101 and an analysis device 102. The mode of operation of the detection device 100 will be explained in more detail below.

Figure 2:
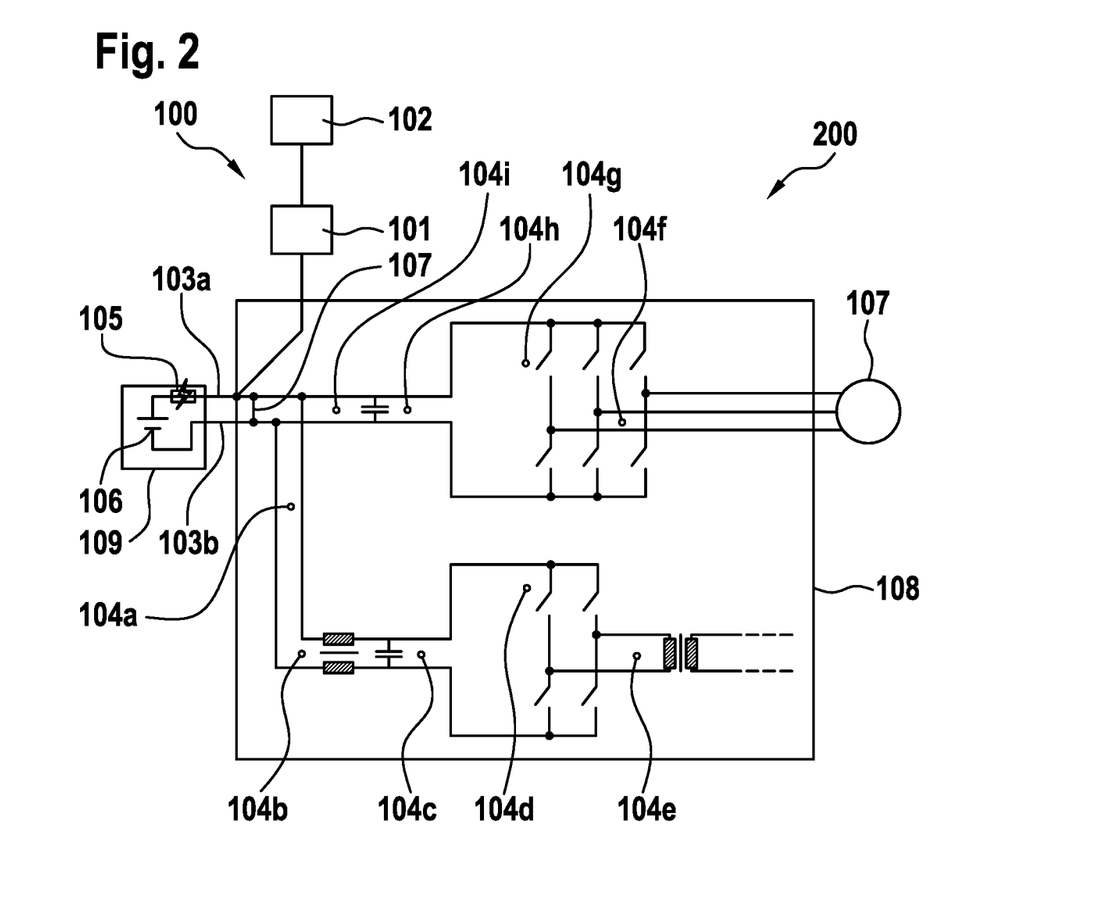
FIGS. 2-5 show schematic circuit diagrams of electronic components according to forms of embodiment of the present invention.
Figure 3:
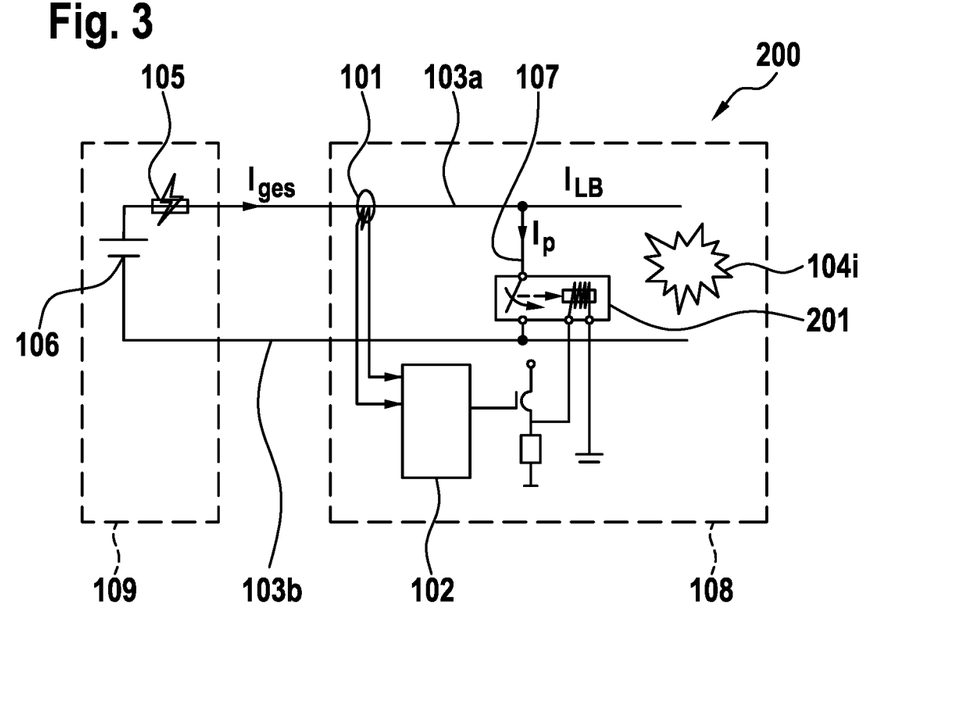

An exemplary electronic component 200 with a detection device 100 is illustrated in FIG. 2. The electronic component 200 comprises a current source 106 with a fuse 105 in a current source housing 109 which, via a first electrical conductor which forms a first current-carrying element 103a and a second electrical conductor which forms an electrically conductive element or a second current-carrying element 103b, supplies a circuit located in a housing 108 with current that drives an electric motor 107. It is possible for arcs to occur here at positions 104a to 104i. The measuring device 101 is designed to measure a current I flowing through the first current-carrying element 103a. The measuring device 101 can comprise a Hall sensor and/or a coupling line parallel to the first current-carrying element 103a. The measuring device 101 transfers the measured current I to the analysis device 102. The analysis device 102 is designed to determine a frequency spectrum of the measured current I and, on the basis of a high-frequency range of the frequency spectrum that has been determined, to detect an arc occurring between the current-carrying elements 103a and 103b, for example the arc 104i. An additional current path 107 is located between the first and the second current-carrying elements 103a and 103b, whose mode of operation is explained more precisely in FIG. 3. When the analysis device 102 detects an arc, the analysis device 102 is designed to close a switch 201 that is inserted in the additional current path 107. In a normal operating state of the electronic component 2, which is to say when the analysis unit has not detected on arc, the switch 201 is here open. The switch 201 can be a power contactor or a solenoid switch. A total current $I_{ges}$ generated by the current source 106 is divided into a short-circuit current $I_p$ that flows through the additional current path 107, and an arc current $I_{LB}$ which flows through the arc 104i between the first current-carrying element 103a and the second current-carrying element 103b. A current still flowing through the rest of the circuit of the electronic component 200 can be neglected, so that the following applies: $I_{ges}=I_p+I_{LB}$.

Figure 4:
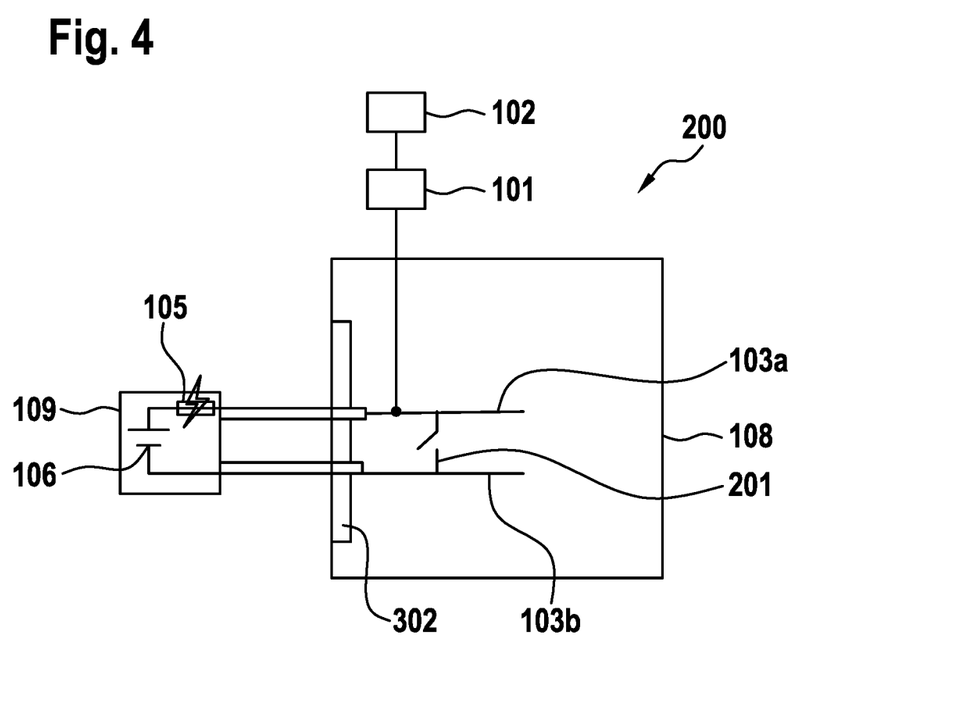

Further, as is illustrated in FIG. 4, an electrically insulating coating 302 is formed on the housing 108 in a surrounding area of the switch 201. The electrically insulating coating 302 prevents a flashover from the switch 201 to the housing 108.

Figure 5:
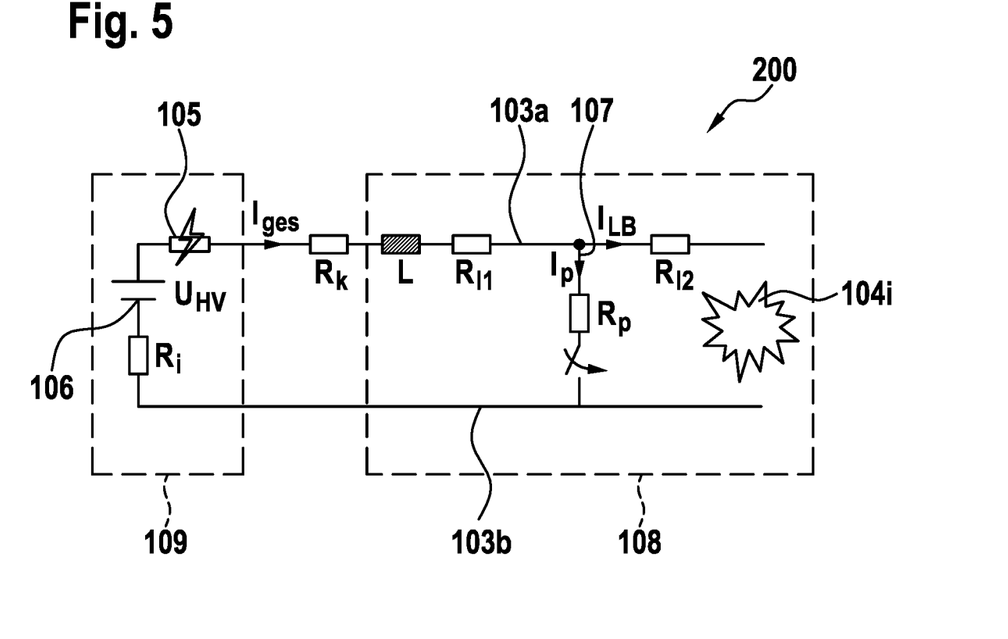

An equivalent circuit diagram of the electronic component 200 is illustrated in FIG. 5. The current source 106 is characterized by a high-voltage $U_{HV}$ and an internal resistance $R_i$, the first current-carrying element 103a by a first resistor $R_k$ before the additional current path 107, and a second resistor $R_{12}$ behind the additional current path 107. The measuring device 101 is characterized by an inductance L and a measuring device resistance $R_{11}$, and the additional circuit 107 by a third resistance $R_p$.

Figure 6:
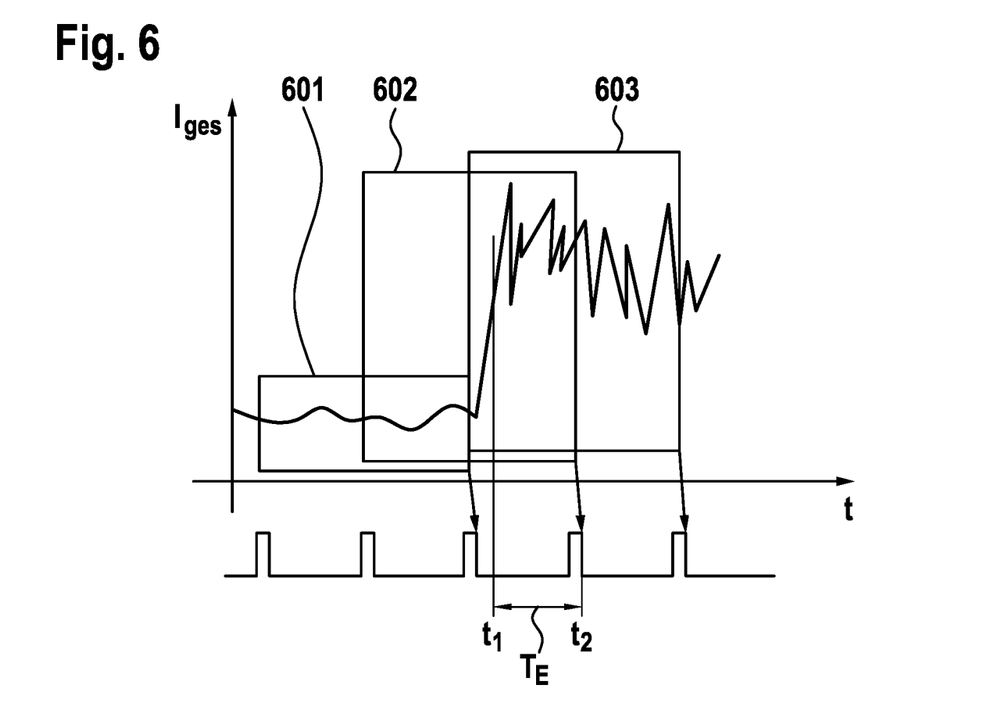
FIG. 6 shows a graph of a measured current against time.
Figure 7:
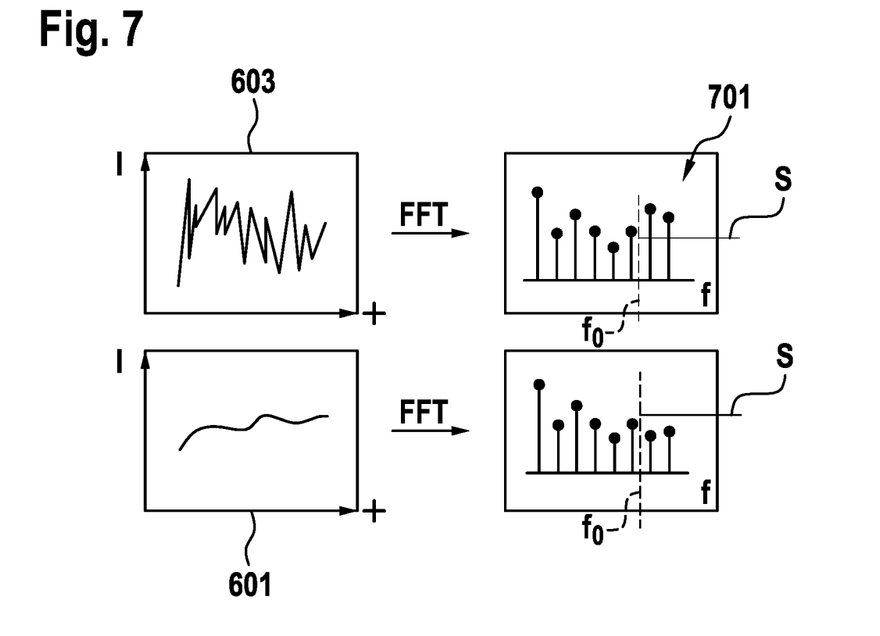
FIG. 7 shows frequency spectra of a measured current.

A graph of the total current $I_{ges}$ measured by the measuring device 101 against time is illustrated in FIG. 6. The current measurement by the measuring device 101 is here divided into a plurality of working cycles 601, 602, 603 with a length of preferably 10 µs. Preferably the working cycles 601, 602, 603 here overlap. For example, half of each of two neighboring working cycles can overlap. The analysis device 102 is designed to analyze a current curve measured within a working cycle 601, 602, 603. The analysis device 102 here determines a frequency spectrum of the measured current I within the working cycle 601, 602, 603, for example through fast Fourier transformation (FFT). Corresponding frequency spectra obtained through fast Fourier transformation are illustrated in FIG. 7 An arc occurs at a first point in time $t_1$. In the upper region of FIG. 7, a current curve is illustrated on the left and a corresponding frequency spectrum of the current I on the right for the third working cycle 603, in which an arc is present. In the lower part of FIG. 7, a current curve is illustrated on the left and a corresponding frequency spectrum of the current I on the right for the first working cycle 601, in which an arc is not present.

The analysis device 102 is designed to analyze a high-frequency range 701 of the frequency spectrum that has been determined, which means a range for frequencies f greater than a threshold frequency $f_0$ of, for example, 10 kHz. If at least one spectral component in the high-frequency range 701 lies above a predetermined threshold value S, the analysis device 102 detects the occurrence of an arc. If all spectral components in the high-frequency range 701 lie below the threshold value S, the analysis device 102 can be designed to detect that there is no arc present. The analysis device 102 thus does not detect an arc in the upper case, whereas in the lower case it detects that an arc is present.

An arc occurring at a first point in time $t_1$ is detected at the end of the second working cycle 602 at a second point in time $t_2$, for which a detection time $T_E$ is required. The detection time $T_E$ is, for example, between 20 and 50 ms.

Figure 8:
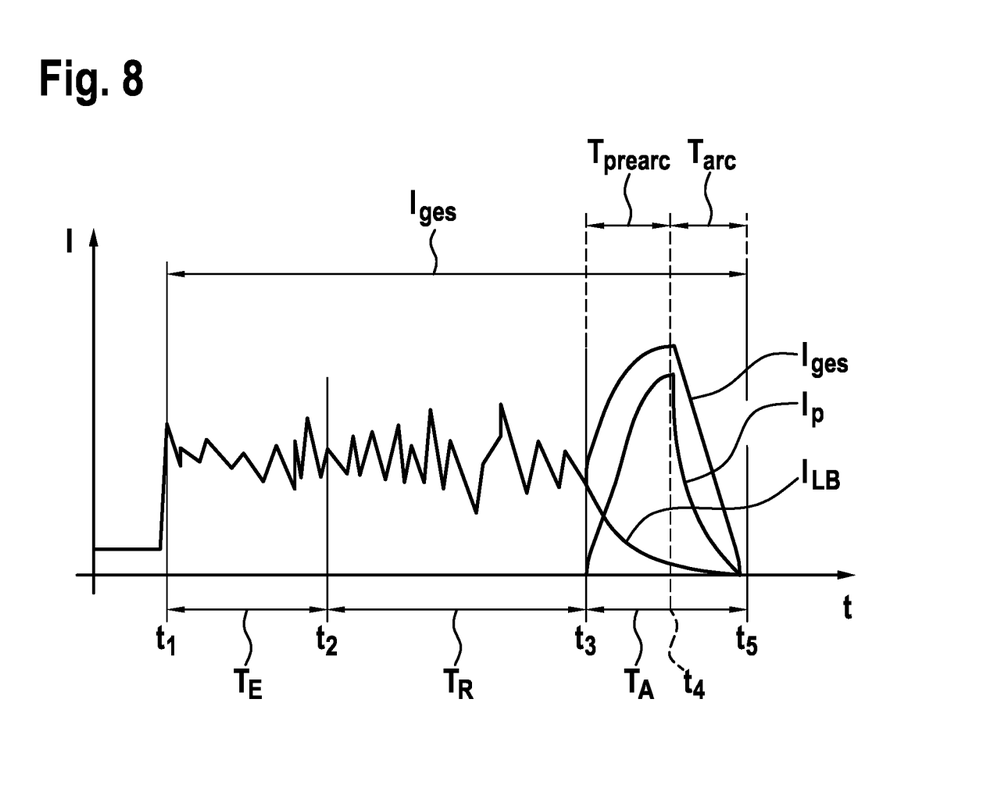
FIG. 8 shows a graph of a measured current against time.

A current curve as a function of time is illustrated in FIG. 8, wherein the total current $I_{ges}$, the short-circuit current $I_p$ through the additional current path 107, and the arc current $I_{LB}$ through the arc are drawn as functions of time t. Following the detection of the arc at the second point in time $t_2$, the analysis device 102 starts to close the switch 201. A reaction time $T_R$ passes before complete closure of the switch at a third point in time $t_3$, wherein the additional current path 107 is also closed. Up until the third point in time $t_3$, the total current $I_{ges}$ is identical to the arc current $I_{LB}$, since no current flows through the additional current path 107, since it is open, and therefore the short-circuit current $I_p$ is equal to zero.

As from the third point in time $t_3$, the arc current $I_{LB}$ falls while the short-circuit current $I_p$ through the additional current path 107 rises. The current source 106 is short-circuited through the fuse 105 and the additional current path 107. At a fourth point in time $t_4$ the fuse 105 triggers and the total current $I_{ges}$ well as the short-circuit current $I_p$ fall, dropping to zero at a fifth point in time $t_5$. A period of time $T_A$ between the third point in time $t_3$ and the fifth point in time $t_5$ corresponds to an action time $T_A$. The action time $T_A$ is divided into a response time or melting time $T_{prearc}$ from the third point in time $t_3$ to the fourth point in time $t_4$, and an arc time $T_{arc}$ from the fourth point in time $t_4$ up to the fifth point in time $t_5$.

The additional current path 107 is preferably designed such that a complete time period $T_{ges}$ between the arising of the arc at the first point in time $t_1$ until the fifth point in time $t_5$ at which the total current $I_{ges}$ drops to 0 is smaller than a predetermined threshold value. The predetermined threshold value corresponds here to a fault reaction time $T_{FRZ}$ which typically corresponds to a time that an arc requires to propagate from a point where the arc arises to the housing 108. The arc should thus be extinguished before it reaches the housing 108. The fault reaction time $T_{FRZ}$ preferably amounts to 100 to 150 ms.

On the assumption that by the third point in time $t_3$ the total current $I_{ges}$ only flows through the additional current path 107, which means that the magnitude of the arc current $I_{LB}$ immediately falls to zero, the total current $I_{ges}$ for the response time or the melting time $I_{prearc}$ before the fuse 105 triggers behaves according to the following formula:

$$I_{ges}(t) = \frac{U_{HV}}{R_{ges}}\left(1 - e^{-\frac{t}{\tau}}\right),$$

where $R_g = R_i + R_k + R_{11} + R_p$ is the total resistance, and $\tau = L/R_{ges}$ is a time constant. The trigger time $t_4$ is found by solving the following equation according to $t_4$:

$$\int_{t_3}^{t_4} I_{ges}(x)^2 dx = Y,$$

where Y is the $I^2t$ value of the fuse 105 for the melting time $I_{prearc}$. The measuring device resistor $R_{11}$ and the third resistor $R_p$ are therefore preferably chosen to be small. The measuring device resistor $R_{11}$, the third resistor $R_p$ and the inductance L are preferably chosen such that the following condition is satisfied:

$$\frac{Z}{I_{ges}(t_4)} + t_4 < T_A, \quad (1)$$

where Z is the $I^2t$ value of the fuse 105 for the arc time $I_{arc}$.

Figure 9:
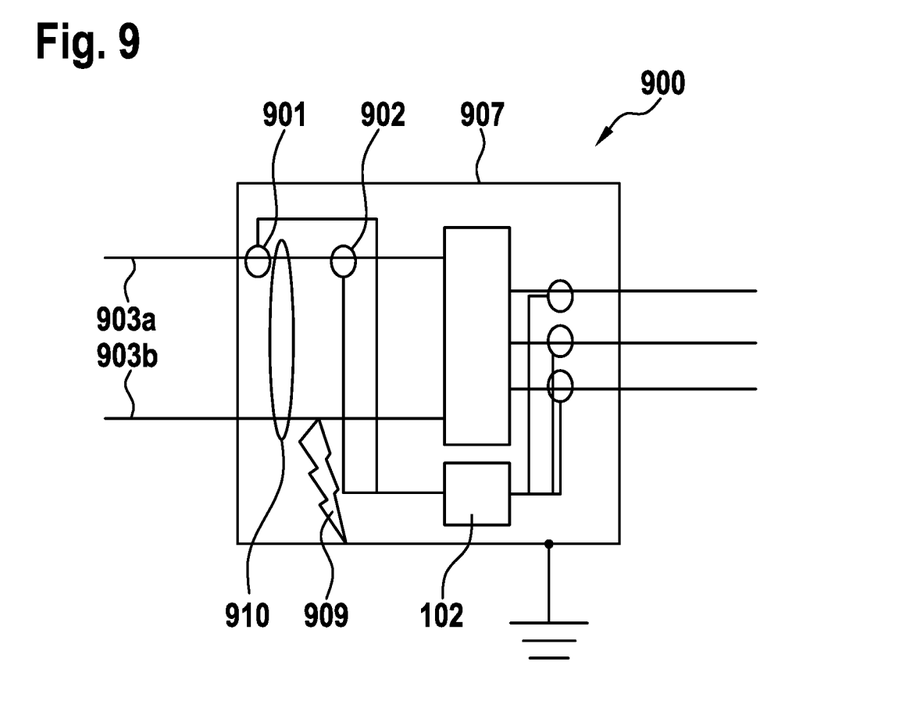
FIG. 9 shows a schematic circuit diagram of an electronic component according to one form of embodiment of the present invention.

FIG. 9 shows a circuit diagram of an electronic component 900 according to a further form of embodiment of the present invention. A common-mode filter 910 is arranged here between a first current-carrying element 903a and a second current-carrying element 903b. A first measuring device 901 is attached at the first current-carrying element 903a before the common-mode filter 910, and a second measuring device 902, which is designed to measure the current I flowing through the first current-carrying element 903a, is attached behind the common-mode filter 910. The currents I measured by the first measuring device 901 and the second measuring device 902 are conveyed to an analysis unit 102. The analysis device 102 is designed, through comparing the frequency spectrum of the current measured by the first measuring device 901 and of the current measured by the second measuring device 902, to detect whether an arc 909 is present and, if an arc 909 is present, whether the arc 909 is occurring between the first current-carrying element 903a and the second current-carrying element 903b or between the first or second current-carrying element 903a and 903b and a housing 907 of the electronic component 900. The analysis device 102 is here designed to determine a comparative figure that expresses a similarity of a first frequency spectrum of the current I measured by the first measuring device 901 and a second frequency spectrum of the current I measured by the second measuring device 902. The greater the comparative figure, the less similar are the frequency spectra.

In the case of an arc between the first current-carrying element 903a and the second current-carrying element 903b, the high-frequency range of the current I through the common-mode filter 910 is attenuated, so that the spectral component of the first current in the high-frequency range differs significantly from the spectral component of the high-frequency range of the second current. If the comparative magnitude lies above a predetermined value, the analysis device 904 is accordingly designed to detect that an arc is occurring between the first current-carrying element 903a and the second current-carrying element 903b.

Figure 10:
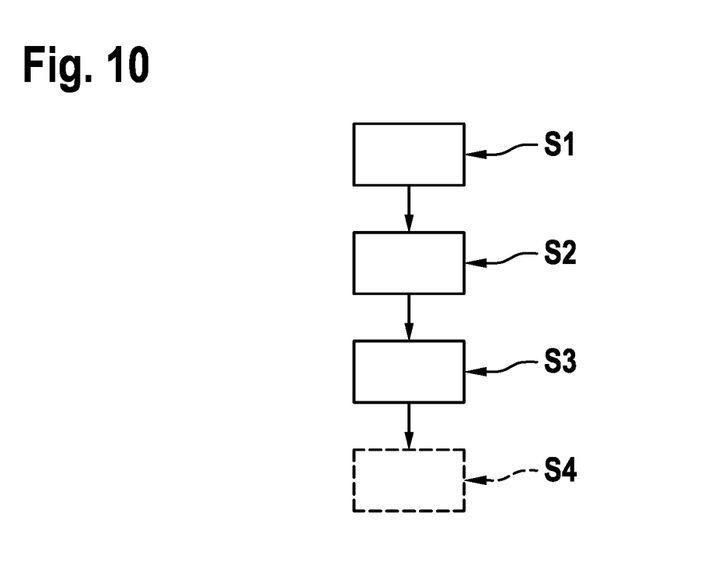
FIG. 10 shows a flow diagram to illustrate a method for detecting an arc.

FIG. 10 shows a flow diagram to illustrate a method for detecting an arc occurring between a first current-carrying element and at least one electrically conductive element. A current I flowing through the first current-carrying element 103a is measured here in a first step S1. In a second step S2 a frequency spectrum of the measured current I is determined, and in a third method step S3 an arc occurring between the current-carrying element 103a and the at least one conductive element is detected on the basis of a high-frequency range of the frequency spectrum that has been determined. In an optional fourth step S4, a switch inserted in an additional current path between the current-carrying element and the conductive element is closed as soon as an arc is detected. The method can be carried out in particular with a detection device according to one of the forms of embodiment described above.

The invention claimed is:

1. A detection device for detecting an arc occurring between a first current-carrying element and a second current-carrying element or between the first current-carrying element and/or the second current-carrying element and a housing of an electronic component, the detection device comprising:
 a first measuring device which is designed to measure a current flowing through the first current-carrying element;
 a second measuring device which is designed to measure a current flowing through the first current-carrying element; and
 an analysis device which is designed, through comparing the frequency spectrum of the current measured by the first measuring device with the frequency spectrum of the current measured by the second measuring device, to detect whether the arc is occurring between the first current-carrying element and the second current-carrying element or between the first current-carrying element and/or the second current-carrying element and the housing of the electronic component,
 wherein a common-mode filter is connected between the first current-carrying element and the second current-carrying element between the first measuring device and the second measuring device.

2. The detection device as claimed in claim 1, wherein the first measuring device comprises a Hall sensor and/or a coupling line parallel to the first current-carrying element.

3. An electronic component, having
 a first current-carrying element;
 a second current-carrying element; and
 a detection device that includes a first measuring device which is designed to measure a current flowing through the first current-carrying element;

a second measuring device which is designed to measure a current flowing through the first current-carrying element; and an analysis device which is designed to determine a frequency spectrum of the measured current from the first measuring device and from the second measuring device, and compare the frequency spectrum of the current measured by the first measuring device with the frequency spectrum of the current measured by the second measuring device, to detect whether an arc has occurred between the first current-carrying element and the second current-carrying element or between the first current-carrying element and/or the second current-carrying element and a housing of the electronic component.

4. The electronic component as claimed in claim 3, wherein a current path with a switch is inserted between the first current-carrying element and the second current-carrying element; and wherein the analysis device is designed to close the switch as soon as the analysis device has detected an arc.

5. The electronic component as claimed in claim 4, wherein the switch comprises a power contactor and/or a solenoid switch.

6. The electronic component as claimed in claim 4, wherein, when the switch closes, a current source which generates the current is short-circuited through a fuse and the current path.

7. The electronic component as claimed in claim 4, wherein the housing at least partially encloses the first current-carrying element, the second current-carrying element, and the switch; and wherein the housing comprises an electrically insulating coating at least in some sections in a surrounding area of the switch.

8. The electronic component as claimed in claim 3, wherein a common-mode filter is connected between the first current-carrying element and the second current-carrying element between the first measuring device and the second measuring device.

9. A method for detecting an arc occurring between a first current-carrying element and a conductive element, the method comprising:

measuring a current flowing through the first current-carrying element;

determining a frequency spectrum of the measured current;

detecting an arc occurring between the first current-carrying element and the conductive element on the basis of a high-frequency range of the frequency spectrum that has been determined; and closing a switch inserted in a current path between the first current-carrying element and the conductive element as soon as the arc is detected, wherein, when the switch closes, a current source which generates the current is short-circuited through a fuse and the current path.

10. The method as claimed in claim 9, wherein the at least one conductive element comprises a second current-carrying element, and the switch is in the current path between the first current-carrying element and the second current-carrying element.

11. The method as claimed in claim 10, wherein the fuse is disposed in series with the first current-carrying element and the current source.

* * * * *